United States Patent [19]
Ma

[11] Patent Number: 5,795,848
[45] Date of Patent: Aug. 18, 1998

[54] OXIDE SUPERCONDUCTOR DEVICES FABRICATED BY IMPURITY ION IMPLANTATION

[75] Inventor: Qi Yuan Ma, New York, N.Y.

[73] Assignee: The University of British Columbia, Vancouver, Canada

[21] Appl. No.: 699,655

[22] Filed: Aug. 19, 1996

Related U.S. Application Data

[62] Division of Ser. No. 390,940, Feb. 17, 1995, Pat. No. 5,547,922, which is a continuation of Ser. No. 061,320, May 14, 1993, abandoned.

[51] Int. Cl.$^6$ .................................................. H01L 39/06
[52] U.S. Cl. .................. 505/162; 505/220; 505/238; 505/700; 505/701; 428/699; 428/701; 428/702; 428/930
[58] Field of Search ........................ 505/162, 220, 505/238, 700, 701; 428/688, 689, 699, 74, 702, 930

[56] References Cited

U.S. PATENT DOCUMENTS

| 5,026,682 | 6/1991 | Clarke et al. | 505/162 |
| 5,051,396 | 9/1991 | Yamazaki | 505/325 |
| 5,053,383 | 10/1991 | Short et al. | 505/325 |
| 5,057,491 | 10/1991 | Housley | 505/190 |
| 5,079,222 | 1/1992 | Yamazaki | 505/211 |
| 5,098,884 | 3/1992 | Yamazaki | 505/471 |
| 5,130,273 | 7/1992 | Mashiko et al. | 437/173 |
| 5,135,908 | 8/1992 | Yang et al. | 505/330 |
| 5,194,419 | 3/1993 | Shiga et al. | 505/325 |
| 5,571,777 | 11/1996 | Tanaka et al. | 505/237 |

OTHER PUBLICATIONS

"Monolithic 77 k dc SQUID Magnetometer", Lee et al., Appl. Phys. Lett. 59 (23), 2 Dec. 1991, pp. 3051–3053.

"Conductus on the Verge of Making SQUIDs", Crawford, New Technology Week, 17 Jun., 1991, p. 3.

"Multichip Module Using Multilayer YBa$_2$Cu$_3$O$_{7-d}$ Interconnects", Burns et al., Appl. Phys. Lett. 62 (12) 12 Mar. 1993, pp. 1435–1437.

"Improved Inhibit Patterning of YBa$_2$Cu$_3$O$_7$ Thin Films", Copetti et al., Appl. Phys. Lett. 61 (25), 21 Dec. 1992, pp.3041–3043.

(List continued on next page.)

*Primary Examiner*—Marie Yamnitzky
*Attorney, Agent, or Firm*—Shlesinger Arkwright & Garvey LLP

[57] ABSTRACT

Superconductivity is inhibited in selected portions of a high temperature superconductor ("HTS") material by patterning the selected portions with a resist. The patterned material is ion-bombarded to implant impurity ions in non-resist-bearing portions of the material. After low temperature annealing, the non-resist-bearing portions of the material lose their superconducting characteristics, but such characteristics are preserved in the material's resist-bearing portions. The material's crystalline structure is preserved, so additional layers can be epitaxially grown atop the inhibited material. Superconductivity is inhibited at a selected depth in a HTS material by subjecting the material to impurity ion bombardment at an energy level controlled to implant ions in the material at the selected depth. After low temperature annealing, the material loses its superconducting characteristics at the selected depth, but such characteristics are preserved at other depths (i.e. above and below the selected depth) and the material's crystalline structure is preserved. A multilayer HTS device and circuit structure can be made by initially depositing an HTS material on a substrate. Superconductivity is inhibited at a first selected depth in the material by ion-bombarding it at a first energy level controlled to implant impurity ions in the material at the first depth. The ion bombardment step is repeated for other selected depths by ion-bombarding the material at other energy levels controlled to implant impurity ions at the other depths. After low temperature annealing the material loses its superconducting characteristics at the selected depths, but such characteristics are preserved at other depths in the material, which retains its crystalline structure.

5 Claims, 9 Drawing Sheets

OTHER PUBLICATIONS

"Low 1/f Noise Single-Layer $YBa_2Cu_3O_x$ dc SQUID at 77 K", Friedl et al., Appl. Phys. Lett. 60 (24), 15 Jun. 1992 pp.3048–3050.

"Novel Method of Patterning YBaCuO Superconducting Thin Films", Ma et al., Appl. Phys. Lett. 55 (9), 28 Aug. 1989, pp.896–898.

"Bi–epitaxial Grain Boundary Junctions in $YBa_2Cu_3O_7$", Char et al., Appl. Phys. Lett., 59 (6), 5 Aug. 1991, pp. 733–735.

"Si–YBaCuO Intermixing and Reactive Patterning Technique", Ma et al., J. Elec. Mat., vol. 21, No. 5, 1992, pp. 487–494.

"Reproducible Growth of High Quality $YBa_2Cu_3O_{7-x}$ Film on (100) MgO With a $SrTio_3$ Buffer Layer by Pulsed Laser Deposition", Cheung et al., Appl. Phys. Lett. 60(25) Jun. 1992, pp. 3180–3182.

"Annealing Effects for Implanted Y–Ba–Cu–O Superconductors", Matsui et al., J. Appl. Phys. 64 (2) Jul. 1988, pp. 936–938.

OXIDE SUPERCONDUCTOR DEVICES FABRICATED BY IMPURITY ION IMPLANTATION

CROSS REFERENCE TO RELATED APPLICATIONS

This application is a division of application Ser. No. 08/390,940 filed 17 Feb., 1995, now U.S. Pat. No. 5,547,922, which is a continuation of application Ser. No. 08/061,320, filed 14 May, 1993 which is now abandoned.

FIELD OF THE INVENTION

This application pertains to a method of inhibiting the superconducting characteristic of a selected portion of a high critical temperature oxide superconductor ("HTS") material. Impurity ions are implanted in the material, causing the selected portion to lose its electrical conductivity and diamagnetism, without degrading the material's crystalline structure. The method allows the growth of epitaxial film on top of the inhibited portion, thus providing an effective way of patterning HTS multilayer devices and circuits.

BACKGROUND OF THE INVENTION

The art of fabricating electronic devices based on HTS film structures has evolved rapidly over the past few years. Microwave HTS devices have entered the market (see Witthers, "Superconductor Devices" edited by Ruggiero et al, Academic Press, 1990, p. 227). Integrated circuit HTS devices have been demonstrated in the lab (see Lee et al, Appl. Phys. Lett. V 59, p. 3051, 1991). Further development of HTS electronic devices requires improved integrated circuit fabrication technologies. The principal problems to be solved concern epitaxial insulating buffer layers and the need for reliable patterning processes.

The inventor and others have studied the Si-YBCO intermixed HTS system in some detail (see Ma et al, Appl. Phys. Lett. V 59 pp. 896–898, 1989; and, J. Elec. Mat. V 21, p. 407, 1992). In these studies, silicon ("Si") was introduced into a YBaCuO ("YBCO") HTS film by thermal diffusion through a Si film or Si substrate during the high temperature process used to form the YBCO film. The studies revealed that the chemical reaction between Si and YBCO, and the consequential formation of Si oxide, inhibit the superconducting characteristics of HTS film, causing the affected film portion to acquire an electrical insulating characteristic in place of its former superconducting characteristic. Accordingly, Si can be used to pattern HTS films by locally inhibiting superconductivity in selected portions of the film.

In general, inhibition processes involve the introduction of a reactive impurity (e.g. Si) to remove oxygen ("O") from an oxide superconductor. For example, introduction of Si ions into a YBCO HTS material as described above, breaks down the Cu-O chemical bonds, with the Si itself becoming oxidized to form an insulating oxide compound. The reactive impurity may be any one of a group of materials which are more reactive with oxygen than the element in the oxide superconductor (e. g. Cu, Ba). Elements such as Si, Ti, Al, Mg, Sr, Ni, B, Ce, Ge, Fe, Zr, or Nb; and, compounds such as $Si_3Ni^4$, $SiF_2$ or $SiF_3$ are suitable reactive impurities. The oxide superconductors include La—Sr—Cu—O, Ca—Sr—Cu—O, Y—Ba—Cu—O, Bi—Sr—Ca—Cu—O, Tl—Ba—Ca—Cu—O, Hg—Ba—Ca—Cu—O, Bi—K—Ba—O, Nd—Ce—Cu—O, etc.

The prior art has evolved a technique for patterning single layer YBCO films (see for example Fork et al, Appl. Phys. Lett., 1990, 57, p. 1137; and, Copetti et al, Appl. Phys. Lett. 61 p. 3041). This technique, referred to as inhibition or reactive patterning, has been used to fabricate various HTS devices, including current controlled switches (see Ma et al, Cryogenics V 30, pp. 1146–1148, 1990); weak-links (see: Meng et al, IEEE Trans. Mag., 1991, 27, p. 3305); SQUIDs (see: Friedl et al, Appl. Phys. Lett., 1992, 60, p. 3048); and, microbolometers (see: Cole, SPIE, 1991, Vol. 1394; and, Parsons et al, Digest of "17th Intl. Conf. on Infrared and Millimeter Waves", Los Angeles, December 1992). HTS microbridges as narrow as 0.13 µm have been made using $Si_3N_4$ for Si-YBCO intermixing (see Kern et al J. Vac. Sci. Tech. B, 1991, 9, p. 2875).

A commonly used prior art patterning technique involves removal of material by chemical etching or ion-milling. This leaves a stepped patterned surface, which causes problems if additional layers are to be grown and patterned atop the initially patterned layer. For example, to make a connection between two HTS layers separated by an insulating layer, ion milling has been used to make a channel through the insulating layer. The channel must be made at a small angle relative to the insulating layer surface and the lower HTS layer surface to facilitate growth of a continuous HTS layer. It is very difficult to control the ion milling process to achieve the necessary angle if the initially patterned layer is not flat.

A further disadvantage of the prior art technique is that an inordinately large number of layers must be processed, with each layer being grown epitaxially at high temperatures. For example, an HTS SQUID magnetometer may require as many as 15 epitaxial layers, with 3 HTS layers (see Lee et al, supra). This increases the cost and decreases the yield of device fabrication. Moreover, some contamination of the HTS film during the patterning process is unavoidable. This degrades device performance. If more layers are processed the risk of contamination increases, lowering the performance characteristics of the fabricated device.

This invention provides a method of inhibiting the superconducting characteristics of a selected portion of an HTS film or single crystal by implantation of impurity ions while preserving the crystalline structure of the HTS material and thereby simplifying the patterning of HTS multilayer structures.

SUMMARY OF THE INVENTION

The invention provides an oxide superconducting-complementary metal oxide semiconductor circuit, comprising: a p-type silicon substrate; first and second n-type silicon dopant regions formed in said substrate; a dielectric layer formed atop said substrate and dopant regions; a buffer layer formed atop said substrate, surrounding said dielectric layer; a high temperature oxide superconductor structure formed atop said buffer layer, surrounding said dielectric layer, said structure comprising first, second and third layers, each layer having portions in which superconductivity is inhibited and portions in which superconductivity is not inhibited, wherein one group of said non-inhibited portions remain in electrical contact through said first, second and third layers and another group of said non-inhibited portions in said first and third layers are electrically insulated by one of said inhibited regions; coupling means for electrically coupling said first dopant region to said one group of said non-inhibited portions; coupling means for electrically coupling said second dopant region to said non-inhibited portion in said third layer of said other group of non-inhibited portions; and, coupling means for electrically coupling said dielectric layer to said non-inhibited portion in said first layer of said other group of non-inhibited portions.

In another aspect, the invention provides devices made by inhibiting superconductivity in selected portions of an HTS material. The material, which may be an HTS film or a single crystal, is patterned by applying a resist material to the selected portions. The patterned material is then subjected to impurity ion bombardment to implant impurity ions in the non-resist-bearing portions of the material. The material is then low temperature annealed. The non-resist-bearing portions of the material lose their superconducting characteristics, but such characteristics are preserved in the resist-bearing portions of the material. The material's crystalline structure is preserved, so additional layers can be epitaxially grown atop the inhibited material.

The invention further provides electronic devices made by inhibiting superconductivity and creating an insulating buffer layer at a selected depth in an HTS material by subjecting the material to impurity ion bombardment at an energy level controlled to implant impurity ions in the material at the selected depth. The implanted ions have a Gaussian depth distribution, the peak value of which depends upon the energy level at which the impurity ions are implanted in the material (the higher the energy level, the greater the ion implantation depth). To obtain a uniform concentration of impurities over a wide range of depths multiple ion bombardment steps can be used, with each step employing a different ion energy level. The ion-implanted material is then low temperature annealed. The material loses its superconducting characteristics at the selected depth, but such characteristics are preserved at other depths in the material (i.e. above and below the selected depth). The material's crystalline structure is preserved, so additional layers can be epitaxially grown atop the inhibited material.

The invention further provides a multilayer HTS structure. An HTS material is initially deposited on a substrate. A mask bearing a pattern which prevents impurity ions from passing through selected portions of the mask is applied to the material. The masked material is subjected to impurity ion bombardment at an energy level controlled to implant impurity ions in the material at a selected depth. The material is then low temperature annealed. The material loses its superconducting characteristics at the selected depth, but not in those regions which the mask shields from the impurity ions. Superconducting characteristics are preserved at other depths in the material (i.e. above and below the selected depth). The material's crystalline structure is preserved, so additional layers can be epitaxially grown atop the inhibited material.

The invention further provides a multilayer HTS structure made by an alternative method. An HTS material is initially deposited on a substrate. A mask bearing a pattern which prevents impurity ions from passing through selected portions of the mask is applied to the material. Superconductivity is inhibited at a first selected depth in the material by subjecting it to impurity ion bombardment at a first energy level controlled to implant impurity ions in the material at the first selected depth. The ion bombardment step is repeated for other selected depths by subjecting the material to impurity ion bombardment at other energy levels controlled to implant impurity ions in the material at the other selected depths. The material is then low temperature annealed. The material loses its superconducting characteristics at the selected depths, but such characteristics are preserved at other depths in the material. The material's crystalline structure is preserved, so additional layers can be epitaxially grown atop the inhibited material.

The invention further provides an interconnected multilayer HTS structure. An HTS material is initially deposited on a substrate. A mask bearing a pattern which prevents impurity ions from passing through selected portions of the mask is applied to the material. Superconductivity is inhibited in selected regions of a first selected layer of the material by subjecting the material to impurity ion bombardment at a first energy level controlled to implant impurity ions in the first layer regions. Superconductivity is also inhibited in selected regions of a second selected layer of the material adjacent the first layer by subjecting the material to impurity ion bombardment at a second energy level controlled to implant impurity ions in the second layer regions. The inhibited regions in each layer are selected such that non-inhibited regions of the first layer contact non-inhibited regions of the second layer. The material is then low temperature annealed. The material loses its superconducting characteristics in the inhibited regions of the first and second layers, but such characteristics are preserved in the non-inhibited regions of each layer. The material's crystalline structure is preserved, so additional layers can be epitaxially grown atop the inhibited material.

BRIEF DESCRIPTION OF THE DRAWINGS

FIG. 7(a) is a cross-sectional illustration (on a greatly enlarged scale) showing a SQUID structure fabricated vertically in an HTS single crystal, in accordance with the present invention; and, FIG. 7(b) is a top plan view (on a greatly enlarged scale) of a mask for use in fabricating the structure of FIG. 7(a).

DETAILED DESCRIPTION OF THE PREFERRED EMBODIMENT

To test the effects of Si ion implantation and low temperature annealing, YBCO films were grown on SrTiO$_3$ (100), LaAlO$_3$ (100), and MgO (100) substrates by pulsed laser ablation. The deposition was carried out in a vacuum chamber using a base pressure of $2\times10^{-7}$ Torr and an oxygen partial pressure of 100–200 mTorr. A high temperature heater was used to maintain the substrate temperature in the 750° to 780° C. range. An excimer pulse laser (248 nm) beam was focused and scanned on the target with fluence of 1–2 J/cm$^2$. The films were typically about 1500 Å thick, had a critical temperature "$T_c$" of about 90° K and a critical current density "$J_c$" in excess of $10^6$ A/cm$^2$ at 77° K.

Si$^+$ ions were implanted into the YBCO films at an energy of 100 keV using a dose of $9.6\times10^{16}$ /cm$^2$. This yields Si concentration of $9\times10^{21}$ /cm$^3$, corresponding to 1.5 Si ions per YBCO lattice. The implanted samples were annealed in air or oxygen for 30 to 60 minutes at a temperature range of 300° to 770° C. The films were observed to be electrically insulating. No current flow was observed in the sample, before or after annealing, when probed by a DC resistivity measurement at room temperature.

Figure 1:
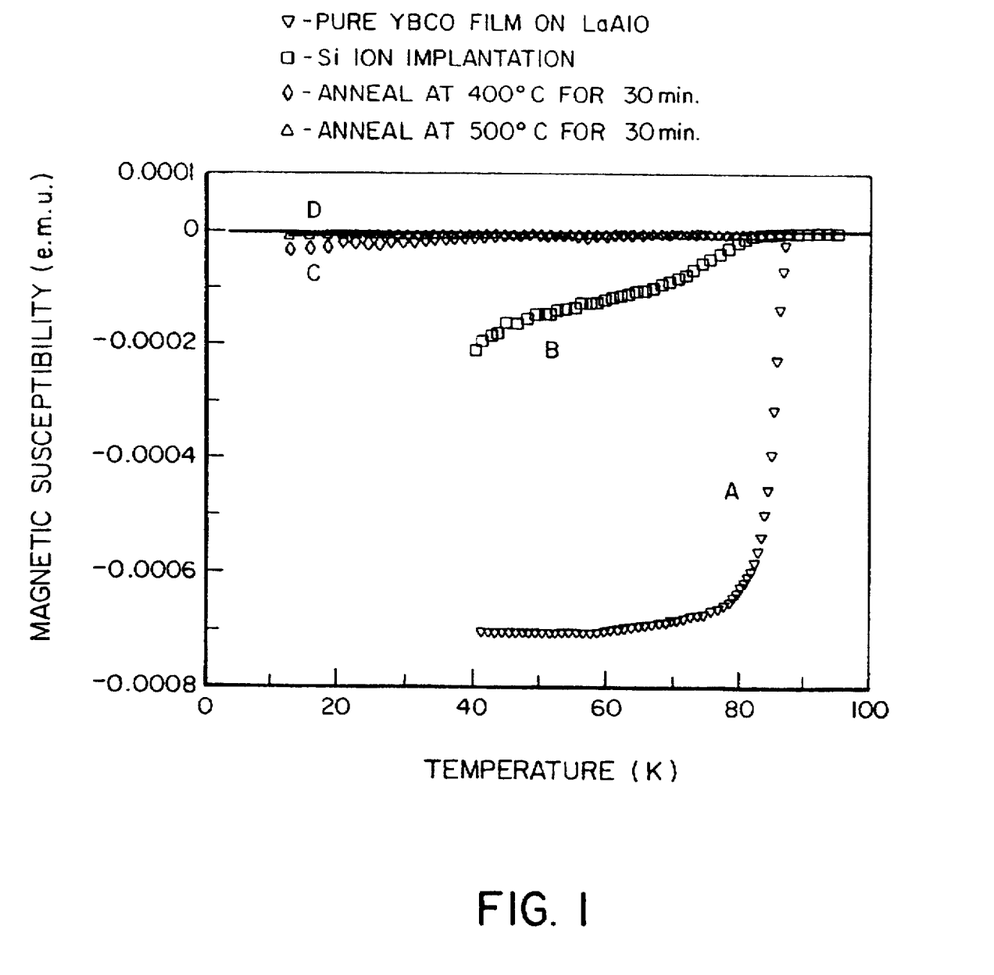
FIG. 1 is a graph on which magnetic susceptibility (in e.m.u.) is plotted as the ordinate, versus temperature (in degrees Kelvin) for various YBCO films to show different degrees of superconductivity inhibition by Si ion implantation and low temperature annealing.

FIG. 1 shows magnetic susceptibilities of YBCO films inhibited with Si as described above. For comparison, lower curve A shows the results of a pure YBCO film deposited on a LaAlO$_3$ substrate. The diamagnetic transition starts at 87° K and the film becomes completely diamagnetic at 77° K. With implanted Si (curve B), the film shows partial diamagnetism below 80° K. Annealing at 400° C. (curve C) resulted in a complete loss of diamagnetism. Although small signs of diamagnetism were observed at temperatures below 25° K, curve C is mostly flat. Further increasing the annealing temperature to 500° C. made the entire film non-superconducting (curve D). No diamagnetic signal was observed in the measurement temperature range of 15° to 95° K.

Figure 2A:
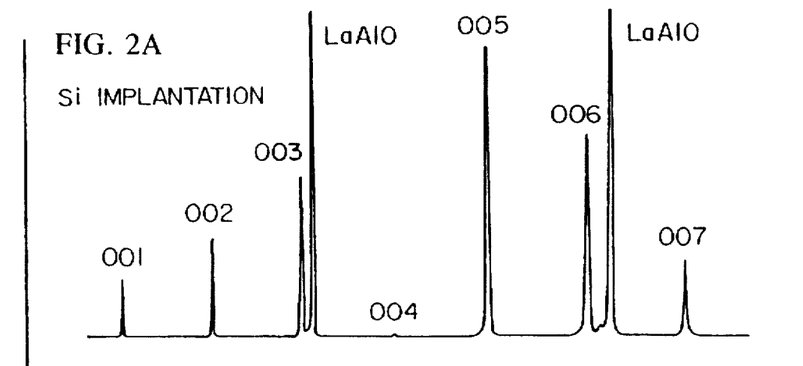
FIG. 2 shows X-ray diffraction patterns for (a) a Si implanted film on an $LaAlO_3$ substrate before annealing; (b) the same film annealed at 500° C. for 30 minutes; and (c) a similar film annealed at 770° C. for 30 minutes.
Figure 2B:
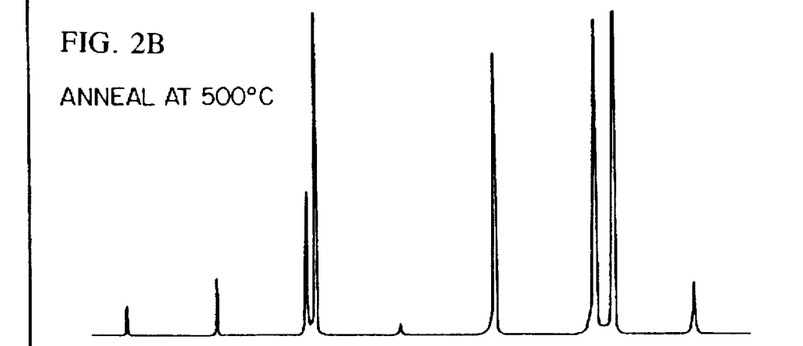
Figure 2C:
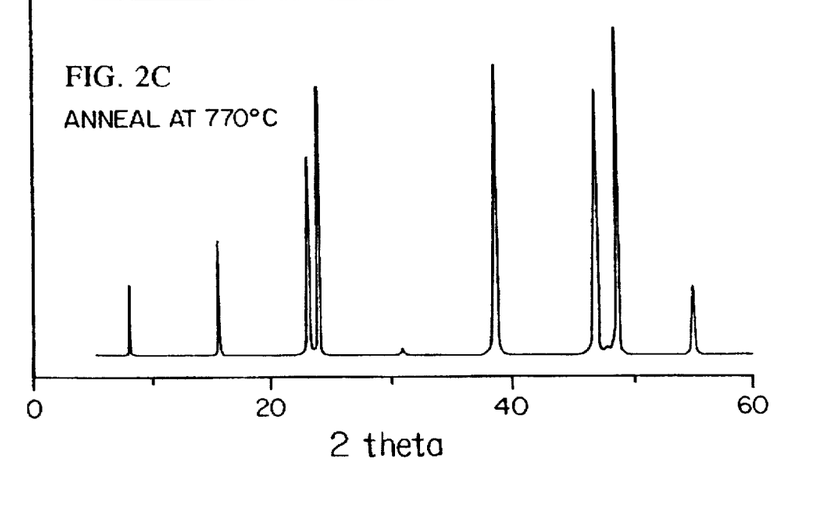

FIG. 2 shows x-ray diffraction patterns for three of the aforementioned samples. Sample (a) is a Si implanted film on LaAlO$_3$ without annealing, (b) is the same film annealed at 500° C. for 30 minutes, and (c) is a similar film annealed at 770° C. for 30 minutes. FIG. 2 clearly shows that the three samples have an identical x-ray pattern (peak position) and relatively similar intensity. This suggests that the lattice parameters are preserved after Si ion implantation. In other words, implantation followed by annealing had no significant effect on the YBCO crystal structures. However, the annealing process seems to repair any damage done to the crystalline structure by the ion implantation process.

These results are quite different from those obtained in a Si-YBCO intermixed system in which Si is introduced by diffusion. In such a system, the Si-YBCO mixing occurs simultaneously with the YBCO film growth. This prevents the film from growing epitaxially. As a consequence, the resulting films are usually amorphous. In an epitaxial growth process, the energy needed is provided partially by substrate heating and partially by the energetic species being evaporated. When a crystalline structure is formed, an amount of energy equivalent to the sum of both energy contributions is required to destroy the structure. In the case of ion implantation, Si ions are injected by acceleration energy and are distributed evenly throughout the film. The annealing process provides the energy required to react Si with YBCO, particularly with the oxygen originally bound to the copper atoms. This reaction destroys the conductivity of the film. It appears that the annealing process does not supply sufficient energy to destroy the crystalline film structure, even if the annealing temperature is raised to the YBCO growth temperature; yet the annealing process does "repair" damage done to the crystalline structure by the ion implantation process.

To further confirm that the crystal structures are preserved after Si ion implantation and annealing, a YBCO film was grown on top of an inhibited film and then annealed at 770° C. The resultant film had superconducting properties almost identical to those of a film grown on a clean substrate.

It can thus be seen that impurity ion implantation followed by low temperature annealing causes the HTS material to lose its electrical conductivity and diamagnetism completely, while its crystalline structure is preserved. Accordingly, epitaxial HTS films can be grown on top of the inhibited area, providing an effective way of patterning HTS multilayer device and circuit structures.

Figure 3A:
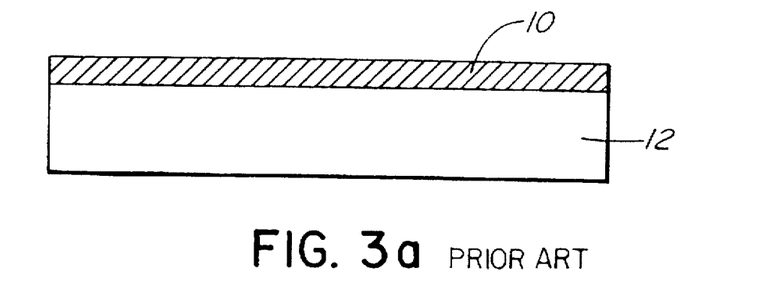
FIGS. 3(a), 3(b) and 3(c) are cross-sectional illustrations (on a greatly enlarged scale) showing the sequence of steps used to fabricate a single layer HTS film in accordance with the prior art inhibition or reactive patterning technique.
Figure 3B:
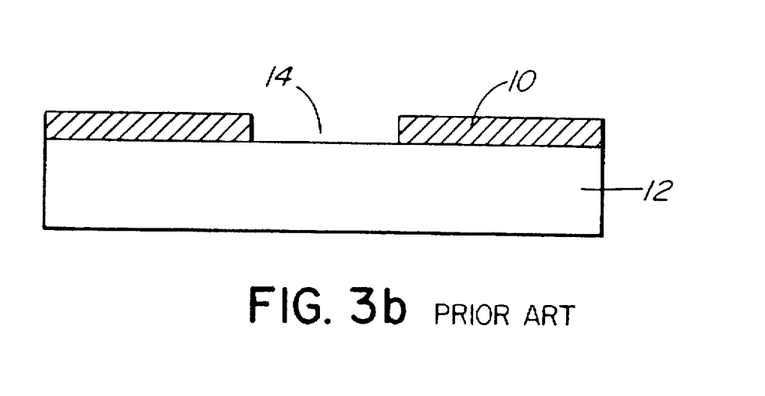
Figure 3C:
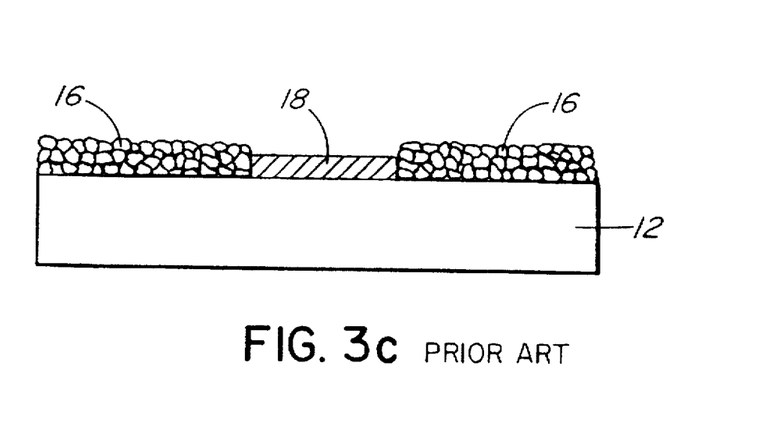

FIGS. 3(a) through 3(c) depict the sequence of steps used to fabricate single layer HTS device structures in accordance with the prior art inhibition or reactive patterning process. As shown in FIG. 3(a), impurity film 10 is initially deposited on substrate 12. The film is then patterned (FIG. 3(b)) by some process such as ion, electron beam or chemical etching, to create a gap 14 in a selected portion of film 10. An HTS film is then epitaxially grown atop the structure, leaving an amorphous, intermixed impurity-HTS film 16 surrounding HTS film 18 as shown in FIG. 3(c).

Figures 4A, 4B:
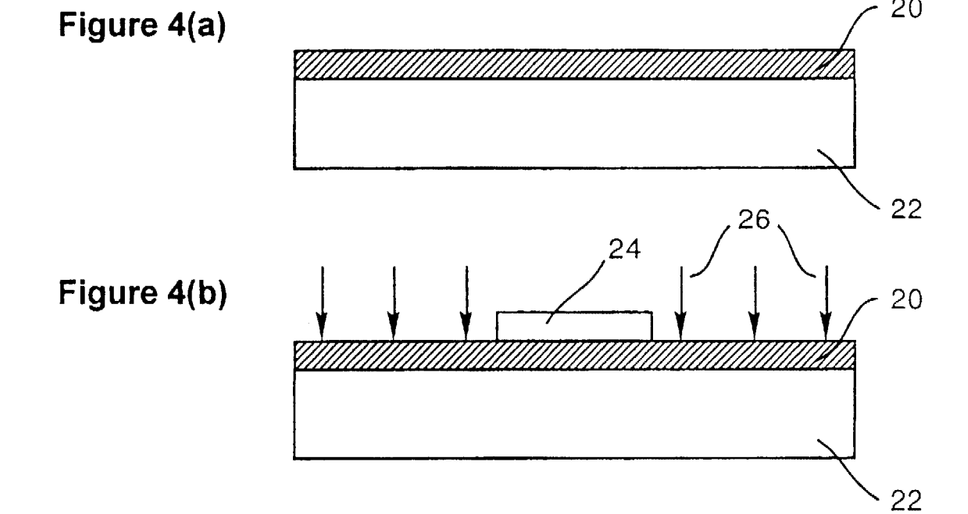
FIGS. 4(a), 4(b) and 4(c) are cross-sectional illustrations (on a greatly enlarged scale) showing the sequence of steps used to fabricate a single layer HTS device and circuit in accordance with the present invention.
Figure 4C:
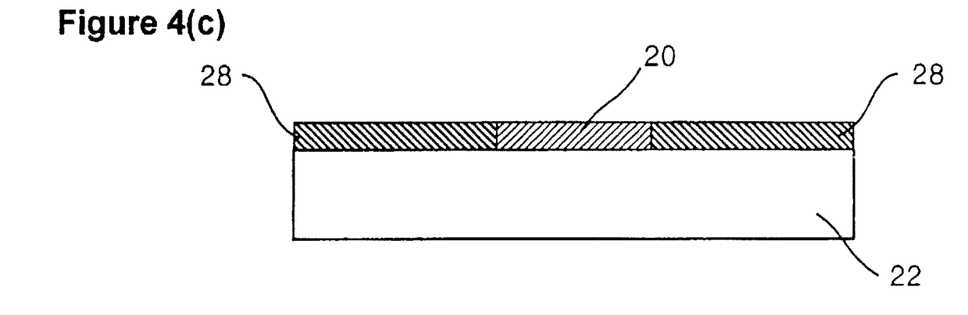

FIGS. 4(a) through 4(c) depict the fabrication of a single layer HTS device in accordance with the invention. As shown in FIG. 4(a) an HTS film 20 is initially uniformly deposited atop substrate 22. A suitable resist 24 is then applied atop portions of film 20 where its superconducting characteristics are to be preserved. The structure is then bombarded with impurity ions (as indicated by arrows 26 in FIG. 4(b)) and then annealed at low temperature (FIG. 4(c)), leaving HTS film 20 unaltered in the region immediately beneath resist 24, surrounded by crystalline structures 28 implanted with impurity ions. Structures 28 have no superconducting characteristics, due to effects of impurity ion implantation and low temperature annealing described above.

Figure 5A:
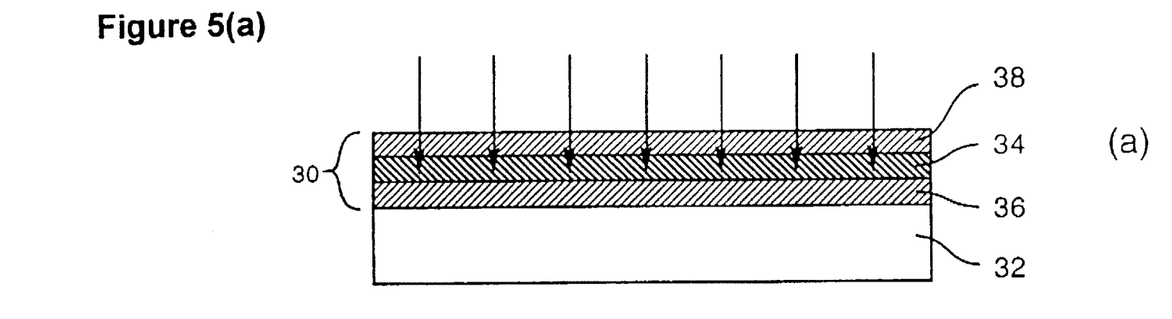
FIGS. 5(a), and 5(b) cross-sectional illustrations (on a greatly enlarged scale) showing the sequence of steps used to fabricate an insulating buffer layer and multilayer HTS device structure in accordance with the present invention.
Figure 5B:
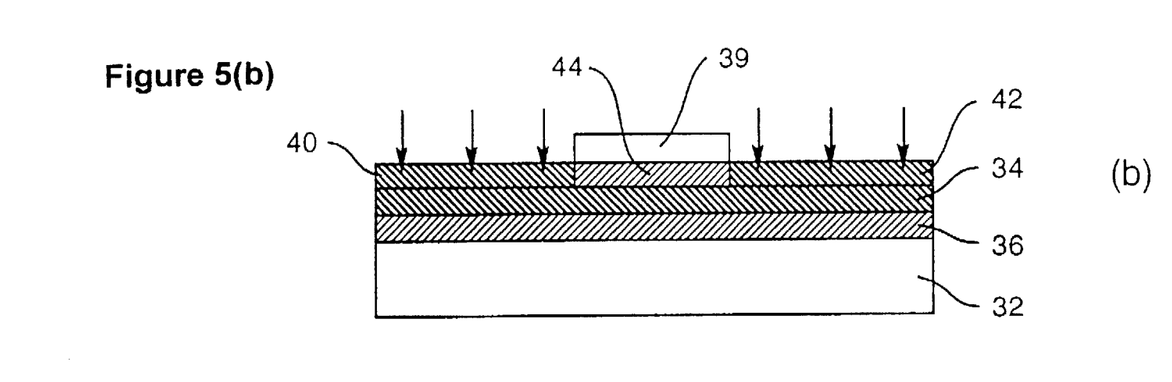

FIGS. 5(a) and 5(b) show how an insulating buffer layer and multilayer HTS device structure can be fabricated by impurity ion implantation. As shown in FIG. 5(a), HTS film 30 is initially deposited atop substrate 32. Impurity ions are implanted in film 30 at a controlled depth within film 30 by regulating the ion beam energy and dosage levels. This creates an insulating layer 34 at the desired depth within film 30, thereby dividing film 30 into two "active" layers 36, 38 separated by insulating layer 34. As shown in FIG. 5(b), upper layer 38 can then be patterned with a resist material 39 and further bombarded (using a lower energy ion beam than was used to create insulating layer 34) with impurity ions as described above in relation to FIG. 4 to pattern layer 38 with non-superconducting regions 40, 42 surrounding superconducting region 44.

Figure 6:
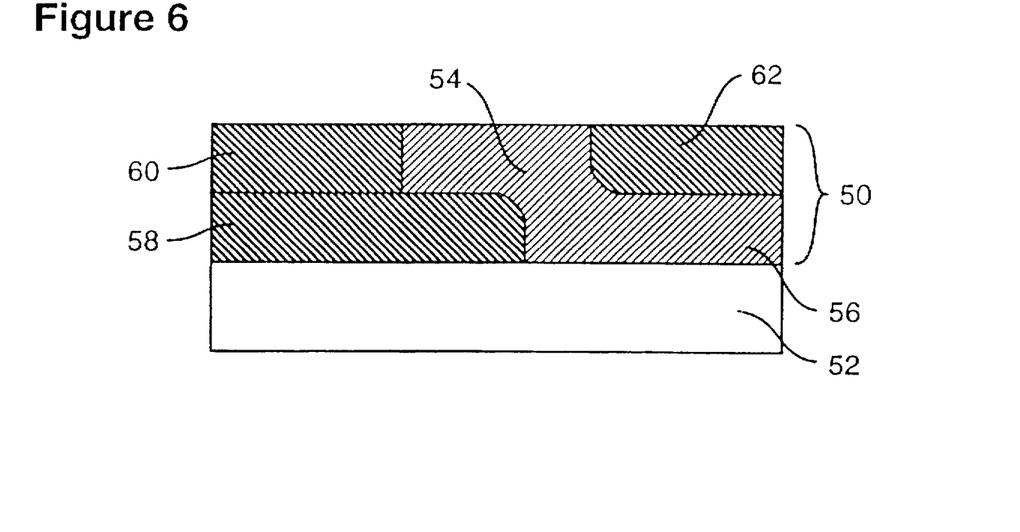
FIG. 6 is a cross-sectional illustration (on a greatly enlarged scale) showing an interconnection fabricated between two active device layers in a multilayer HTS film structure, in accordance with the present invention.

FIG. 6 shows how a circuit interconnect can be formed in an HTS film structure fabricated in accordance with the invention to provide electrical conductivity between two adjacent layers. Specifically, FIG. 6 illustrates a device 50 formed atop substrate 52. HTS material 54 is initially deposited on substrate 52 and then subjected to successive ion bombardment/patterning steps. For example, a first higher energy level bombardment is used to inhibit the superconductivity of a lowermost portion 58 of the HTS material, leaving an adjacent lower portion 56 which retains superconducting characteristics. A second lower energy ion bombardment is then used to selectively inhibit superconductivity in upper regions 60,62 which surround upper superconducting region 54. It will be noted that regions 54 and 56 overlap one another, thereby preserving electrical conductivity between them.

Figures 7A, 7B:
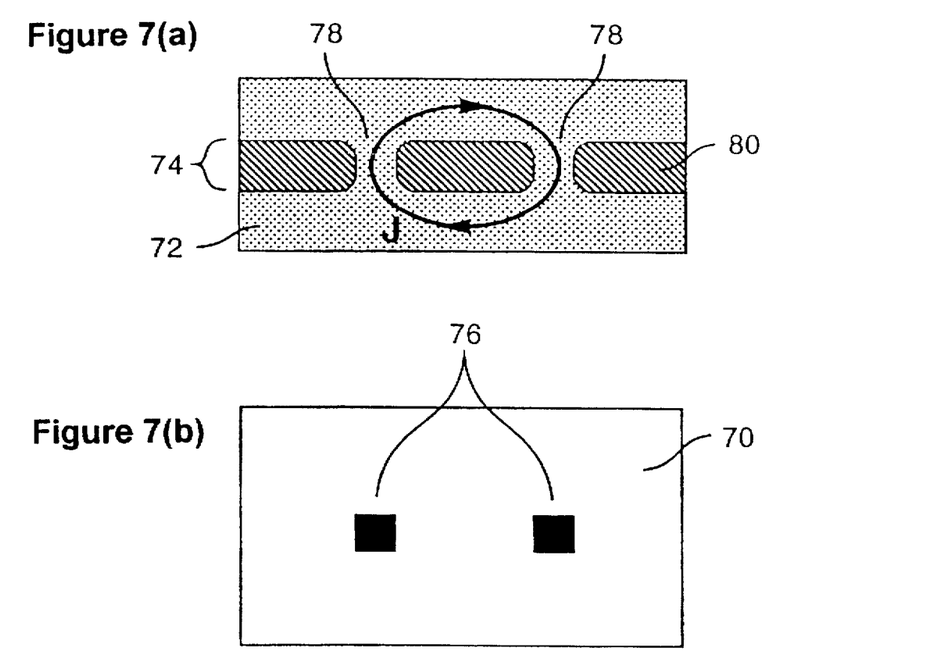

FIG. 7(a) shows a SQUID structure fabricated with the aid of mask 70 shown in FIG. 7(b). Mask 70 is laid atop HTS structure 72, which is then subjected to ion bombardment controlled to inhibit superconductivity in a centralized region 74. Mask 70 prevents ion penetration through its regions 76.

Accordingly, gaps 78 remain in the insulating layer 80 formed in the HTS material 72 at region 74. The resultant structure is a vertical SQUID, and can be formed in either a single crystal or a thick film.

Figure 8:
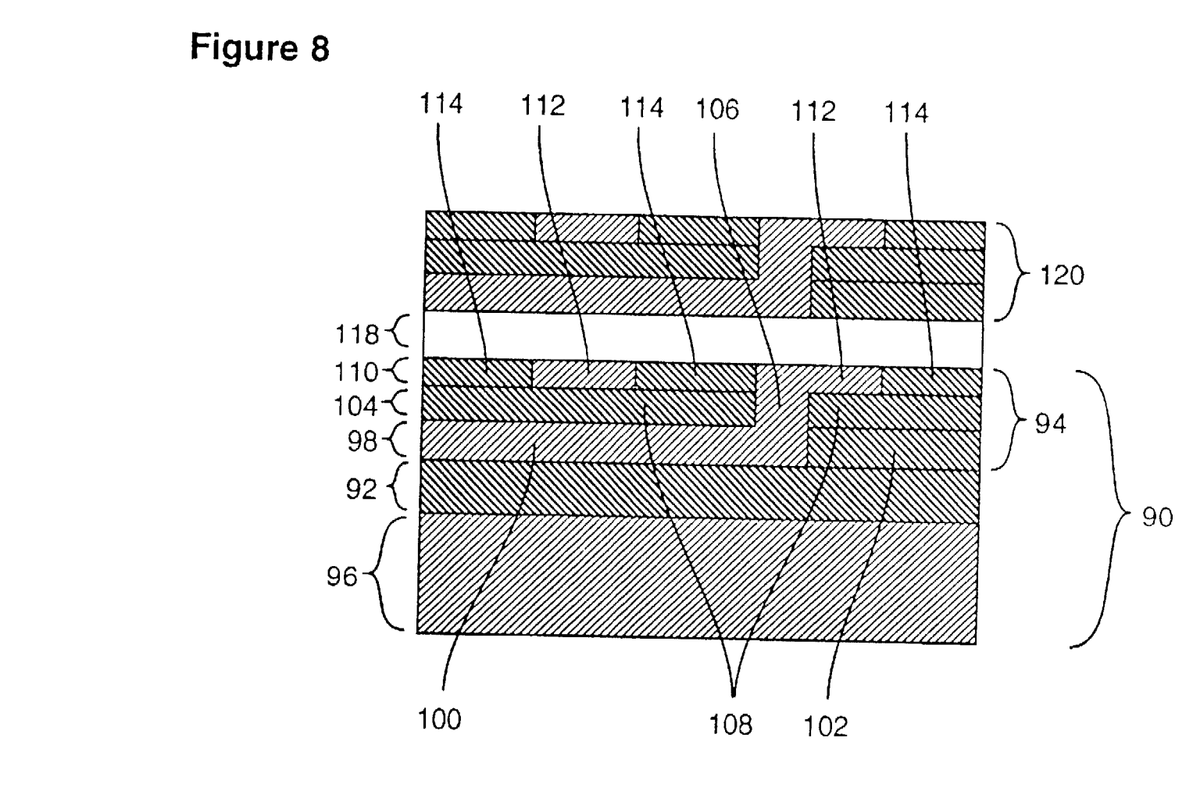
FIG. 8 is a cross-sectional illustration (on a greatly enlarged scale) of a generalized multilayer HTS structure showing two tri-layer inhibition structures separated by a buffer insulating layer and fabricated on a HTS single crystal wafer or thick film in accordance with the present invention.

FIG. 8 shows a generalized multilayer HTS structure fabricated in accordance with the invention in HTS single crystal or thick film 90. A first buffer insulating layer 92 is fabricated by impurity ion implantation as described above in relation to FIG. 5(a). First buffer layer 92 separates active device tri-layer structure 94 from grounding layer 96. Tri-layer inhibition structure 94 comprises first, second and third layers 98, 104, 110. First layer 98, consisting of superconducting region 100 surrounded by insulating or inhibited regions 102, is initially created by patterned impurity ion implantation in regions 102, as described above in relation to FIG. 6. Second layer 104, consisting of superconducting region 106 surrounded by insulating regions 108, is then created atop first layer 98 by patterned impurity ion implantation in regions 108. Third layer 110, consisting of HTS active devices 112 surrounded by insulating regions 114 is then created atop second layer 104 by patterned impurity ion implantation in regions 114. In accordance with the foregoing disclosure, it will be understood that the energy levels employed to implant ions in first buffer layer 92 are higher than those used to implant ions in regions 102, which are in turn higher than those used to implant ions in regions 108, which are in turn higher than those used to implant ions in regions 114.

It will be noted that the successive patterns used to fabricate tri-layer structure 94 are such that inhibited regions 102, 108 overlap one another in depth, as do regions 108,114. Consequently, superconducting region 100 in first layer 98 is electrically connected to superconducting region 112 in third layer 110 by "window" 106 in second layer 104.

To facilitate growth of second tri-layer inhibition structure 120 atop structure 94, a dielectric buffer layer 118 is deposited epitaxially atop first structure 94. Buffer layer 118 can be a dielectric buffer film made from a suitable dielectric material (e. g. SrTiO$_3$, CeO, LaAlO$_3$, etc.) having a crystal lattice structure similar to that of the HTS material employed. Dielectric buffer 118 should be made sufficiently thick to prevent any impurity ions from passing through it during any consecutive ion implantation processes.

After buffer layer 118 is fabricated, a new HTS film is then grown epitaxially atop layer 118. Second tri-layer inhibition structure 120 is then fabricated in the new film by patterned impurity ion implantation as described above for the first tri-layer inhibition structure 94. The mask patterns used to fabricate structure 120 can be identical to those used to fabricate structure 94 (as shown in the FIG. 8 example) or a different mask pattern can be used, depending upon the nature of the desired device. The process can be repeated many times until a complete device or circuit system is obtained.

Figure 9A:
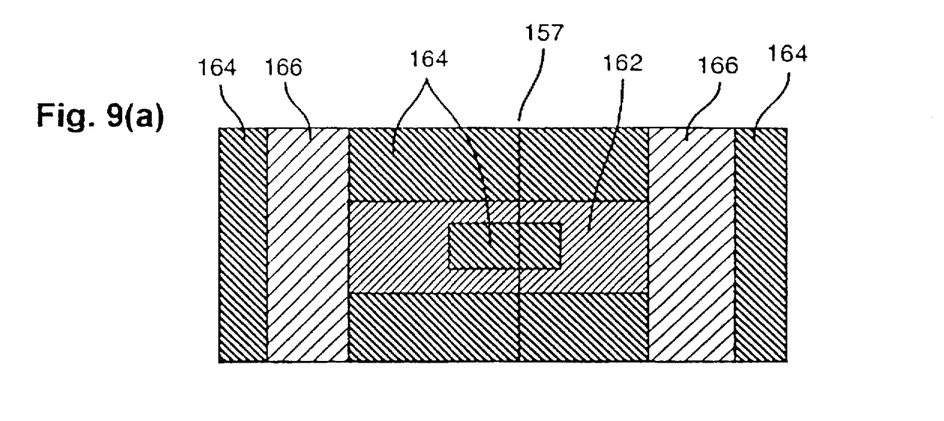
FIGS. 9(a) and 9(b) are respectively top plan and cross-sectional illustrations (on a greatly enlarged scale) of a multilayer HTS SQUID magnetometer structure fabricated in accordance with the present invention.
Figure 9B:
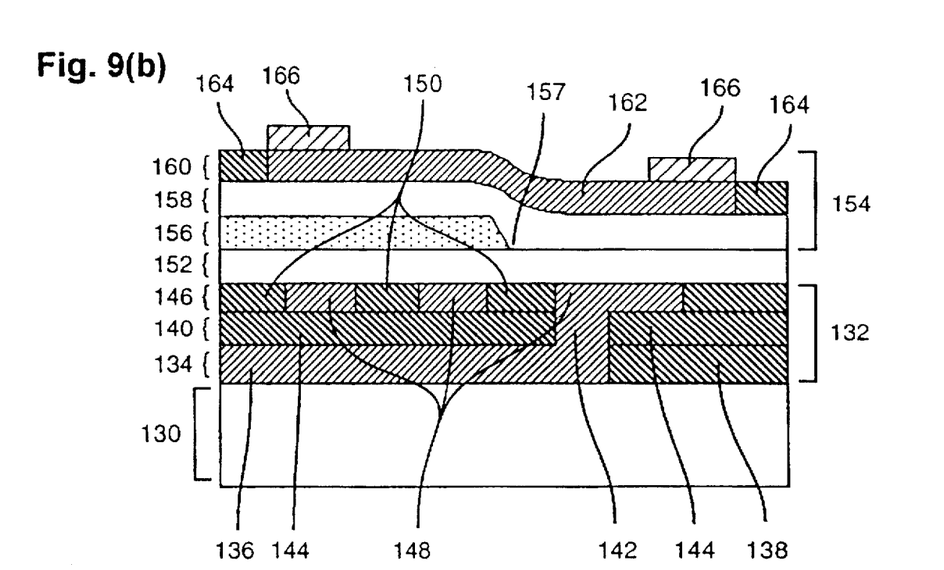

FIG. 9 shows a multilayer HTS SQUID structure fabricated in accordance with the invention atop substrate 130. A first HTS film is epitaxially grown on substrate 130 and a tri-layer inhibition structure 132 is fabricated within that film, as described above in relation to FIG. 8. As shown in FIG. 9(b), first layer 134 constitutes a superconducting crossover and ground plane region 136 separated by insulating regions 138; second layer 140 constitutes contact window 142 surrounded by insulating regions 144; and, third layer 146 constitutes an HTS input coil and pickup loop 148 surrounded by insulating regions 150. Superconducting ground plane 136 is electrically connected to HTS input coil and pickup loop 148 through contact window 142. Structure 132 thus forms a tri-layer HTS flux transformer.

A first epitaxial buffer layer 152 is then deposited atop transformer 132. Buffer layer 152 can be a dielectric buffer film made from a suitable dielectric material having a crystal lattice structure similar to that of the HTS material employed. Dielectric buffer 152 should be made sufficiently thick to prevent any impurity ions from passing through it during any consecutive ion implantation processes. A commonly used HTS bicrystal DC SQUID structure 154 is then fabricated atop buffer layer 152.

SQUID 154 consists of first thin seed buffer layer (e. g. 10 nm thick MgO) 156, second buffer layer (SiTiO$_3$ or CeO$_2$) 158, and HTS film layer 160. Seed layer 156 is fabricated by chemical etching or ion milling, such that the crystal orientation of second buffer layer 158 and HTS layer 160 is altered by about 45° at the grain boundary junction 157 formed at the edge of seed layer 156. HTS film layer 160 is grown epitaxially atop second buffer layer 158. Film 160 is fabricated by masked impurity ion implantation to form a superconducting DC SQUID pattern 162 surrounded by inhibited regions 164 (compare FIGS. 9(a) and 9(b). The device is completed by coupling metal contact pads 166 to SQUID 162 and flux transformer 132 by conventional deposition and photolithography techniques.

Figure 10:
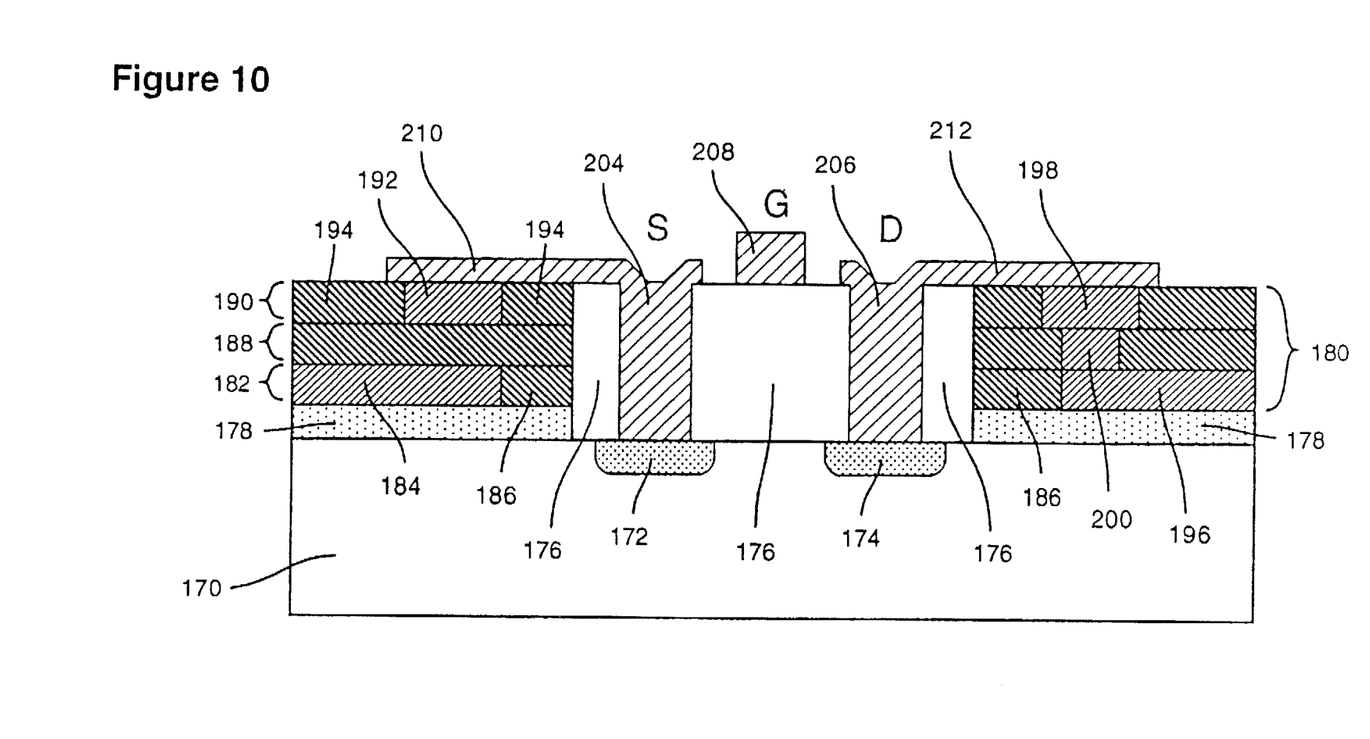
FIG. 10 is a cross-sectional illustration (on a greatly enlarged scale) of an HTS-semiconductor hybrid structure fabricated on a silicon wafer in according with the present invention.

FIG. 10 shows a cross-section of a high temperature oxide superconducting-complementary metal oxide semiconductor ("HTS-CMOS") circuit fabricated in accordance with the invention atop silicon substrate 170. The CMOS has a conventional field effect transistor structure: p-type silicon substrate 170 is used as the n-channel material and two doped n-type silicon regions 172, 174 serve as source ("S") and drain ("D"), respectively. A SiO$_2$ dielectric layer 176 is grown and patterned in conventional fashion to provide a gate ("G") dielectric layer. The HTS interconnects are fabricated in accordance with the present invention, as will now be described.

A buffer layer 178 comprising a material such as yttria stabilized zirconia ("YSZ") having a crystal lattice matched, in one orientation, to that of the HTS material employed, and to that of Si substrate 170 in another orientation, is grown and patterned atop substrate 170. HTS film 180 is then grown epitaxially atop buffer layer 178 and patterned by conventional etching or ion milling methods, using the same mask as was used to pattern buffer layer 178. HTS film 180 is then further processed to form an interconnected tri-layer inhibition structure, as described above in relation to FIG. 8. More particularly, as depicted in FIG. 10, first layer 182 is patterned by impurity ion implantation to form a superconducting regions 184, 196 surrounded by insulating or inhibited regions 186. Second layer 188 is then patterned atop first layer 182 by impurity ion implantation at a lower energy level than was used to implant impurity ions in regions 186 to form superconducting contact window 200 surrounded by insulating regions. Third layer 190, comprising HTS active devices 192, 198 surrounded by insulating regions 194 is then patterned atop second layer 188 by impurity ion implantation at a still lower energy level.

It will be noted that inhibited regions 186, 188 overlap one another in depth, as do regions 188, 194. Superconducting regions 196, 198 in layers 182, 190 are electrically coupled to one another by window 200 in layer 188. Metal contacts 210, 212 are deposited and patterned in conventional fashion to couple source electrode 204 to HTS active device 192; and, to couple drain electrode 206 to HTS ground plane 196 through superconducting regions 198, 200. Another connection (not shown) can be provided to couple gate electrode 208 to superconducting region 184 through another HTS window fabricated in a manner similar to window 200.

In practising the invention, impurity ion bombardment at energy levels in the range of 20 to 200 KeV, and at a dosage in the range of $10^{14}$ to $10^{17}$ ions/cm$^2$ is preferred. High temperature oxide superconductors selected from the group consisting of La—Sr—Cu—O, Ca—Sr—Cu—O, Y—Ba—Cu—O, Bi—Sr—Ca—Cu—O, Tl—Ba—Ca—Cu—O, Hg—Ba—Ca—Cu—O, Bi—K—Ba—O, and Nd—Ce—Cu—O can be employed in fabricating devices in accordance with the invention. Impurities such as Si, Ti, Al, Mg, Sr, Ni, B, Ce, Ge, Fe, Zr, or Nb may be implanted in the high temperature oxide superconductor material by ion bombardment, as aforesaid. Patterning according to the invention may be carried out in an HTS layer epitaxually grown on top of a previously patterned HTS layer.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A superconducting quantum interference device comprising:

a) a substrate;

b) an oxide superconductor material on said substrate, said material having a surface;

c) an inhibited layer within said oxide superconductor material, said inhibited layer containing implanted impurity ions of a species which is more reactive with oxygen than an element in said oxide superconductor material in a concentration sufficient to render said oxide superconductor material substantially electrically insulating within said inhibited layer; p1 d) a first superconducting layer adjacent said inhibited layer within said oxide superconductor material between said inhibited layer and said surface;

e) a second superconducting layer adjacent said inhibited layer within said oxide superconductor material between said inhibited layer and said substrate; and, f) a pair of spaced apart superconducting gaps in said inhibited layer, said gaps connecting said first and second superconducting layers to permit electrical current to flow through said gaps in a closed loop extending in a plane generally perpendicular to said surface.

2. The superconducting quantum interference device of claim 1 wherein said oxide superconductor material has a crystalline structure and said crystalline structure is substantially continuous and unbroken throughout said first and second superconductor layers and said inhibited layer.

3. The superconducting quantum interference device of claim 2 wherein said oxide superconductor material is selected from the group consisting of La—Sr—Cu—O, Ca—Sr—Cu—O, Y—Ba—Cu—O, Bi—Sr—Ca—Cu—O, Tl—Ba—Ca—Cu—O, Hg—Ba—Ca—Cu—O, Bi—K—Ba—O, and Nd—Ce—Cu—O.

4. The superconducting quantum interference device of claim 3 wherein said impurity ions are ions selected from the group consisting of ions of Si, Ti, Al, Mg, Sr, Ni, B, Ce, Ge, Fe, Zr, and Nb.

5. The superconducting quantum interference device of claim 1 wherein said oxide superconductor material comprises a film about 1500 Å in thickness.

* * * * *